United States Patent
Takada

(10) Patent No.: US 11,502,018 B2
(45) Date of Patent: Nov. 15, 2022

(54) HOLDING AND IGNITION PREVENTION DEVICE FOR SEMICONDUCTOR ELEMENT, AND POWER CONVERSION DEVICE USING HOLDING AND IGNITION PREVENTION DEVICE

(71) Applicant: Mitsubishi Electric Corporation, Tokyo (JP)

(72) Inventor: Atsutoshi Takada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 172 days.

(21) Appl. No.: 16/319,550

(22) PCT Filed: Sep. 12, 2016

(86) PCT No.: PCT/JP2016/076762
§ 371 (c)(1),
(2) Date: Jan. 22, 2019

(87) PCT Pub. No.: WO2018/047323
PCT Pub. Date: Mar. 15, 2018

(65) Prior Publication Data
US 2019/0221497 A1    Jul. 18, 2019

(51) Int. Cl.
*H01L 23/40*    (2006.01)
*H05K 7/20*    (2006.01)

(52) U.S. Cl.
CPC .......... *H01L 23/4006* (2013.01); *H01L 23/40* (2013.01); *H05K 7/20* (2013.01);
(Continued)

(58) Field of Classification Search
CPC ..... H01L 23/4006; H01L 23/40; H05K 7/209; H05K 7/20
(Continued)

(56) References Cited

U.S. PATENT DOCUMENTS 5,019,942 A    5/1991 Clemens
5,237,485 A *    8/1993 Cognetti de Martiis ....................
H01L 23/4006
174/16.3
(Continued)

FOREIGN PATENT DOCUMENTS

JP    56-029959 U1    3/1981
JP    5-15441 U    2/1993
(Continued)

OTHER PUBLICATIONS

International Search Report for PCT/JP2016/076762 dated Nov. 22, 2016 [PCT/ISA/210].
(Continued)

*Primary Examiner* — Krystal Robinson
(74) *Attorney, Agent, or Firm* — Sughrue Mion, PLLC

(57) ABSTRACT

A problem to be solved by the present invention is to prevent smoke emission and ignition of a power semiconductor element that is installed inside a power conversion device connected to a battery in the field of power electronics, for example. A semiconductor holding device according to the present invention includes: a package which houses a power semiconductor element therein and dissipates heat to a cooler from a first surface of the package; a plate covering a second surface opposing the first surface of the package; and a pressing member pressing the plate against the package.

15 Claims, 4 Drawing Sheets

(52) U.S. Cl.
CPC ........ *H05K 7/209* (2013.01); *H01L 2023/405* (2013.01); *H01L 2023/4031* (2013.01); *H01L 2023/4081* (2013.01); *H01L 2023/4087* (2013.01)

(58) Field of Classification Search
USPC ........................................................ 361/704
See application file for complete search history.

(56) References Cited

U.S. PATENT DOCUMENTS

| | | | |
|---|---|---|---|
| 5,450,284 A | 9/1995 | Wekell | |
| 6,088,226 A | 7/2000 | Rearick | |
| 6,233,159 B1 * | 5/2001 | Harman | H01L 23/367 |
| | | | 174/16.3 |
| 6,465,728 B1 * | 10/2002 | McLaughlin | H01L 23/4093 |
| | | | 174/16.3 |
| 6,587,344 B1 | 7/2003 | Ross | |
| 6,674,164 B1 * | 1/2004 | Rippel | H01L 23/4093 |
| | | | 257/713 |
| 6,714,414 B1 * | 3/2004 | Dubovsky | H01L 23/4006 |
| | | | 165/185 |
| 7,151,671 B2 * | 12/2006 | Hyodo | H05K 5/0217 |
| | | | 361/717 |
| 7,277,299 B2 * | 10/2007 | Yoshida | H01H 37/043 |
| | | | 257/718 |
| 8,908,374 B2 * | 12/2014 | Takatsuka | H05K 7/209 |
| | | | 361/679.54 |
| 2010/0164670 A1 | 7/2010 | Nakahori et al. | |
| 2012/0155030 A1 * | 6/2012 | Breitenbach | H05K 7/209 |
| | | | 29/428 |

FOREIGN PATENT DOCUMENTS

| | | |
|---|---|---|
| JP | 2006-339341 A | 12/2006 |
| JP | 5120245 B2 | 1/2013 |
| JP | 2016-101065 A | 5/2016 |

OTHER PUBLICATIONS

Notice of Reasons for Refusal dated Nov. 19, 2019 from the Japanese Patent Office in application No. 2018-537972.
Communication dated Sep. 4, 2019, from the European Patent Office in counterpart European Application No. 16915741.9.

* cited by examiner

HOLDING AND IGNITION PREVENTION DEVICE FOR SEMICONDUCTOR ELEMENT, AND POWER CONVERSION DEVICE USING HOLDING AND IGNITION PREVENTION DEVICE

CROSS REFERENCE TO RELATED APPLICATIONS

This application is a National Stage of International Application No. PCT/JP2016/076762 filed Sep. 12, 2016.

TECHNICAL FIELD

The present invention relates to a semiconductor element holding device that is installed inside a power conversion device connected to a battery, and a power conversion device using the holding device, in the field of power electronics.

BACKGROUND ART

In a conventional semiconductor element holding structure, a spring support member including a leaf spring portion and a supporting portion brings the leaf spring portion into abutment against an upper surface of a semiconductor element, thus fixing the semiconductor element to the heat dissipation plate side with a predetermined elastic force (see, e.g., Patent Document 1). In general, it is often the case that the power semiconductor element provided inside a vehicle-mounted power conversion device is fixed in the same manner as that described above.

CITATION LIST

Patent Document

Patent Document 1: Japanese Patent No. 5120245

SUMMARY OF THE INVENTION

Problems to be Solved by the Invention

In the vehicle-mounted power conversion device disclosed in Patent Document 1, the vehicle-mounted power conversion device is connected to a lead battery on the vehicle side. Accordingly, if a short circuit failure occurs in a rectification diode, a large current flows in from the lead battery, resulting in smoke emission and ignition.

An object of the present invention is to provide a countermeasure with a simple structure, against smoke emission and ignition that are caused by a short circuit failure of the power semiconductor element mounted inside the power conversion device.

Solution to the Problems

A semiconductor element holding device according to the present invention includes: a package which houses a power semiconductor element therein and dissipates heat to a cooler from a first surface of the package; a plate covering a second surface opposing the first surface of the package; and a pressing member pressing the plate against the package.

Effect of the Invention

According to the present invention, the package housing the power semiconductor element therein is pressed by the plate, so that oxygen will not flow in from cracks caused in the package in the event of a short circuit failure of the power semiconductor element, thus making it possible to prevent smoke emission and ignition of the power semiconductor element.

DESCRIPTION OF EMBODIMENTS

Embodiment 1

Figure 1:
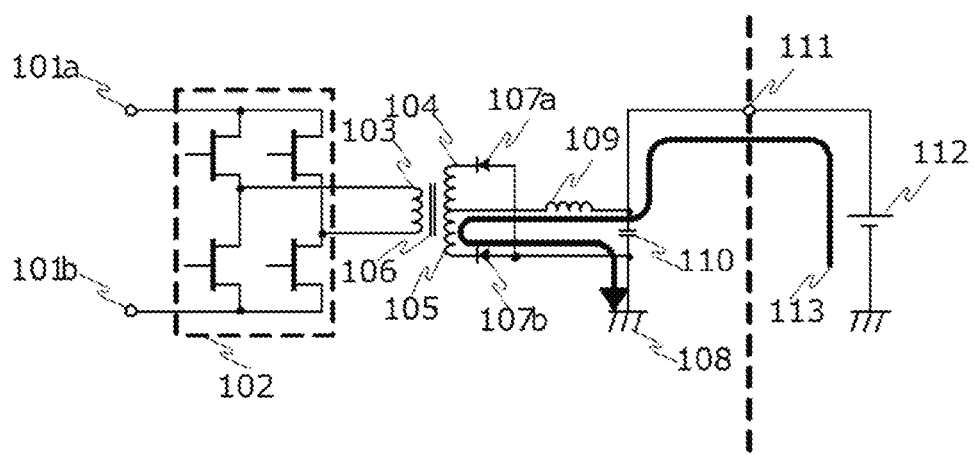
FIG. 1 is a circuit configuration diagram illustrating a DC-DC converter according to Embodiment 1 of the present invention.

Hereinafter, preferred embodiments of a semiconductor element holding structure according to the present invention will be described with reference to the drawings. In the following description, identical or equivalent elements are denoted by identical reference numerals.

FIG. 1 is a circuit configuration diagram illustrating a DC-DC converter serving as a power conversion device according to Embodiment 1 of the present invention.

The secondary side of the transformer of this circuit employs a center tap-type diode rectification scheme, and can obtain a rectified waveform equivalent to that obtained by a full-wave rectification circuit. In FIG. 1, a voltage higher than the output voltage of an output terminal 111 is applied to input terminals 101a and 101b to which a DC voltage is applied. The DC voltage that has been inputted into the input terminals 101a and 101b is converted into an AC voltage by an inverter circuit 102. In general, the inverter circuit 102 is constituted by a switching element such as an IGBT (Insulated Gate Bipolar Transistor) or a MOSFET (Metal Oxide Semiconductor Field-Effect Transistor).

The AC voltage that has been outputted from the inverter circuit 102 is applied to a transformer primary winding 103. An AC voltage that is similar to a rectangular wave and generated by switching the semiconductor element provided in the inverter circuit 102 in accordance with a driving signal supplied from a driving circuit (not shown) is applied to the transformer primary winding 103.

The secondary side of the transformer includes a transformer upper secondary winding 104 and a transformer lower secondary winding 105 to which an AC voltage converted into a varied voltage level depending on the turns ratio of the transformer is applied.

The transformer primary winding 103, the transformer upper secondary winding 104, and the transformer lower secondary winding 105 are electromagnetically coupled by a magnetic substance core 106. The windings constituting the transformer are disposed around a middle leg provided on the magnetic substance core 106.

Rectification elements 107a and 107b are each constituted by a power semiconductor element, and rectify the AC voltage outputted from the transformer upper secondary winding 104 and the transformer lower secondary winding 105. A ripple voltage waveform rectified by the rectification elements 107a and 107b is smoothed by a smoothing circuit including a reactor 109 and a capacitor 110, and the DC voltage obtained by the smoothing circuit is outputted from the output terminal 111. In the present embodiment, a ground terminal 108 of the secondary-side circuit is set at the same potential as the metal casing, and therefore the output voltage is outputted between the output terminal 111 and the metal casing.

In the DC-DC converter configured in this manner, the DC input voltage supplied from the input terminals 101a and 101b undergoes switching by the inverter circuit 102 so as to generate an input AC voltage, and the input AC voltage is supplied to the transformer primary winding 103. Then, the generated input AC voltage is transformed, and is outputted as an output AC voltage from the transformer upper secondary winding 104 and the transformer lower secondary winding 105. Then, the output AC voltage is rectified by the rectification elements 107a and 107b, and is also smoothed by the smoothing circuit including the reactor 109 and the capacitor 110, and a DC voltage is supplied from the output terminal 111 to a lead battery 112 provided on the vehicle.

However, if a short circuit failure occurs in the rectification element 107b, a large current flows into the rectification element 107b from the lead battery 112 as indicated by an arrow 113, and the rectification element 107b may cause smoke emission and ignition. That is, in the case where a very thin aluminum wire is used to provide connection inside the rectification element 107b, the aluminum wire is melted earlier than a quick-blown fuse provided on the vehicle side, so that the epoxy resin around the aluminum wire is carbonized, thus forming an electric conduction path from the lead battery 112. In addition, the large current causes cracks in the epoxy resin, and oxygen is supplied from the cracked locations, thus causing smoke emission and ignition.

A semiconductor element holding structure that prevents a supply of oxygen caused by cracks in the epoxy resin described above is shown in FIG. 2. Although a description will be given of the rectification elements 107a and 107b shown in FIG. 1 as an example of the semiconductor element, the holding structure can be used not only for the rectification element, but also for a power semiconductor element in which the same problem occurs.

Figure 2:
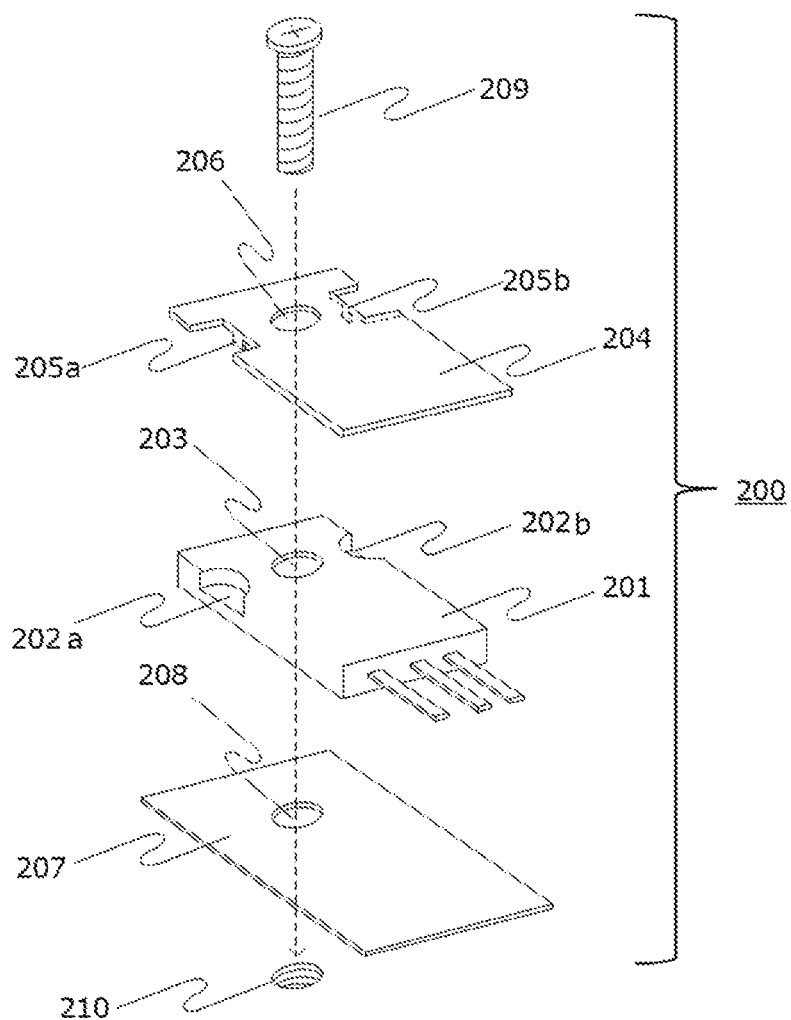
FIG. 2 is an assembly perspective view showing a semiconductor element holding structure according to Embodiment 1 of the present invention.

FIG. 2 is an assembly perspective view showing a holding structure 200 for a rectification element package 201 housing therein the rectification element 107a or 107b shown in FIG. 1.

In the rectification element package 201, recesses 202a and 202b that are each cut out into a semicircular shape are formed on both sides of an upper portion on a side opposite to the side from which terminals of the rectification element are exposed, and a package hole portion 203 for passing a fixing screw 209 therethrough is provided between the recesses 202a and 202b.

A plate 204 having an area one size larger than the area of an upper surface of the rectification element package 201 is disposed in contact with the upper surface. The plate 204 is made of a material such as metal or resin, and plate protrusions 205a and 205b that are bent perpendicularly from the upper surface of the plate toward the rectification element package 201 are formed at both side portions that correspond to the recesses 202a and 202b of the rectification element package 201. The plate protrusions 205a and 205b are engaged with arc-shaped side surfaces of the recesses 202a and 202b so as to position the rectification element package 201 and the plate 204 relative to each other. Also in the plate 204, a plate hole portion 206 is provided at the same position as the package hole portion 203.

A heat dissipation sheet 207 is disposed in contact with a lower surface of the rectification element package 201. A heat dissipation sheet hole portion 208 through which the fixing screw 209 passes is also formed in the heat dissipation sheet 207. Also, a heat spreader (not shown) made of a metal is disposed on the lower surface of the rectification element package 201.

The fixing screw 209 passes through the plate hole portion 206, the package hole portion 203, and the heat dissipation sheet hole portion 208, and is screwed with a screw groove of a cooler hole portion 210 provided in a cooler (not shown). Consequently, the plate 204, the rectification element package 201, and the heat dissipation sheet 207 are fixed together, and are mechanically fixed to the cooler.

Since the plate 204 is pressed against the upper surface of the rectification element package 201 by such a holding structure 200, it is possible to block any oxygen from flowing due to occurrence of cracks in the rectification element package 201 when the rectification element undergoes a short circuit failure. Since the area of the plate 204 is configured to be larger than the area of the rectification element package 201, the upper surface of the rectification element package 201 can be reliably covered by the plate 204. In addition, as a result of the recesses 202a and 202b being engaged with the plate protrusions 205a and 205b, it is possible to prevent positional displacement and rotation of the plate 205 during assembly. It is noted that the shapes of the recesses 202a and 202b and the plate protrusions 205a and 205b are not limited to those shown in FIG. 2, and may be any shapes as long as they can prevent positional displacement and rotation.

In addition, the heat spreader is disposed on the lower surface of the rectification element package, thus providing a structure into which oxygen is difficult to flow. Furthermore, pressing against the cooler is performed by the fixing screw 209. Accordingly, the cooler serves the same function as that of the plate 204 and prevents entry of oxygen.

Embodiment 2

Another embodiment of the semiconductor element holding structure will be described with reference to FIG. 3. Although a description will be given of the rectification elements 107a and 107b shown in FIG. 1 as an example of the semiconductor element, the holding structure can be used not only for the rectification element, but also for a power semiconductor element in which the same problem occurs, as in Embodiment 1.

Figure 3:
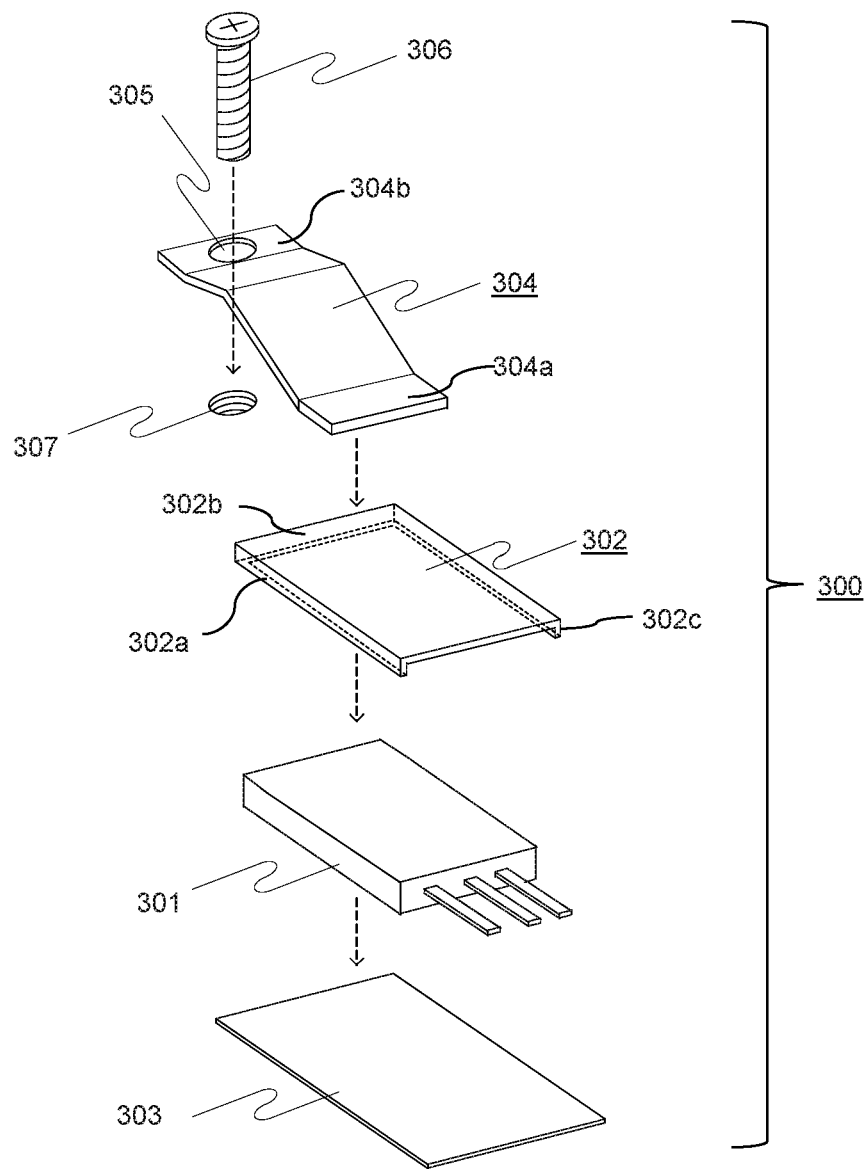
FIG. 3 is an assembly perspective view showing a semiconductor element holding structure according to Embodiment 2 of the present invention.

FIG. 3 is an assembly perspective view showing a holding structure 300 for a rectification element package 301 housing therein the rectification element 107a or 107b shown in FIG. 1.

A plate 302 having an area one size larger than the area of an upper surface of the rectification element package 301 is disposed in contact with the upper surface. The plate 302 is made of a material such as metal or resin, and outer peripheral surfaces 302a, 302b, and 302c that are bent perpendicularly from the upper surface of the plate toward the rectification element package 301 are formed on the outer peripheral portion of the plate 302. The outer peripheral surfaces 302a, 302b, and 302c are engaged with the respective corresponding side portions of the rectification element package 301. A heat dissipation sheet 303 is disposed in contact with a lower surface of the rectification element package 301. One end portion 304a of a spring member 304 is in contact with the upper surface of the plate 302, a fixing screw 306 passes through a spring member hole portion 305 which is formed in the other end portion 304b and through which the fixing screw passes, and thus the fixing screw 306 is screwed with a screw groove of a cooler hole portion 307 provided in a cooler. Consequently, the spring member 304 is mechanically fixed to the cooler, and also presses the plate 302, the rectification element package 301, and the heat dissipation sheet 303 against the cooler.

Since the plate 302 is pressed against the upper surface of the rectification element package 301 by such a holding structure 300, it is possible to block any oxygen from flowing due to occurrence of cracks in the rectification element package 301 when the rectification element undergoes a short circuit failure. Since the area of the plate 302 is configured to be larger than the area of the rectification element package 301, the upper surface of the rectification element package 301 can be reliably covered by the plate 302. In addition, the plate 302 has the perpendicular outer peripheral surfaces 302a, 302b, and 302c along the outer peripheral portion of the plate, and is mounted so as to hold the rectification element package 301 therein during assembly. Accordingly, it is possible to prevent positional displacement and rotation of the plate during assembly. It is noted that, as in Embodiment 1, a heat spreader (not shown) is disposed on the lower surface of the rectification element package 301, thus providing a structure into which oxygen is difficult to flow. Furthermore, pressing against the cooler is performed by the spring member 304. Accordingly, the cooler serves the same function as that of the plate 302 and prevents entry of oxygen.

Embodiment 3

Another embodiment of the semiconductor element holding structure will be described with reference to FIG. 4. Although a description will be given of the rectification elements 107a and 107b shown in FIG. 1 as an example of the semiconductor element, the holding structure can be used not only for the rectification element, but also for a power semiconductor element in which the same problem occurs, as in Embodiments 1 and 2.

Figure 4:
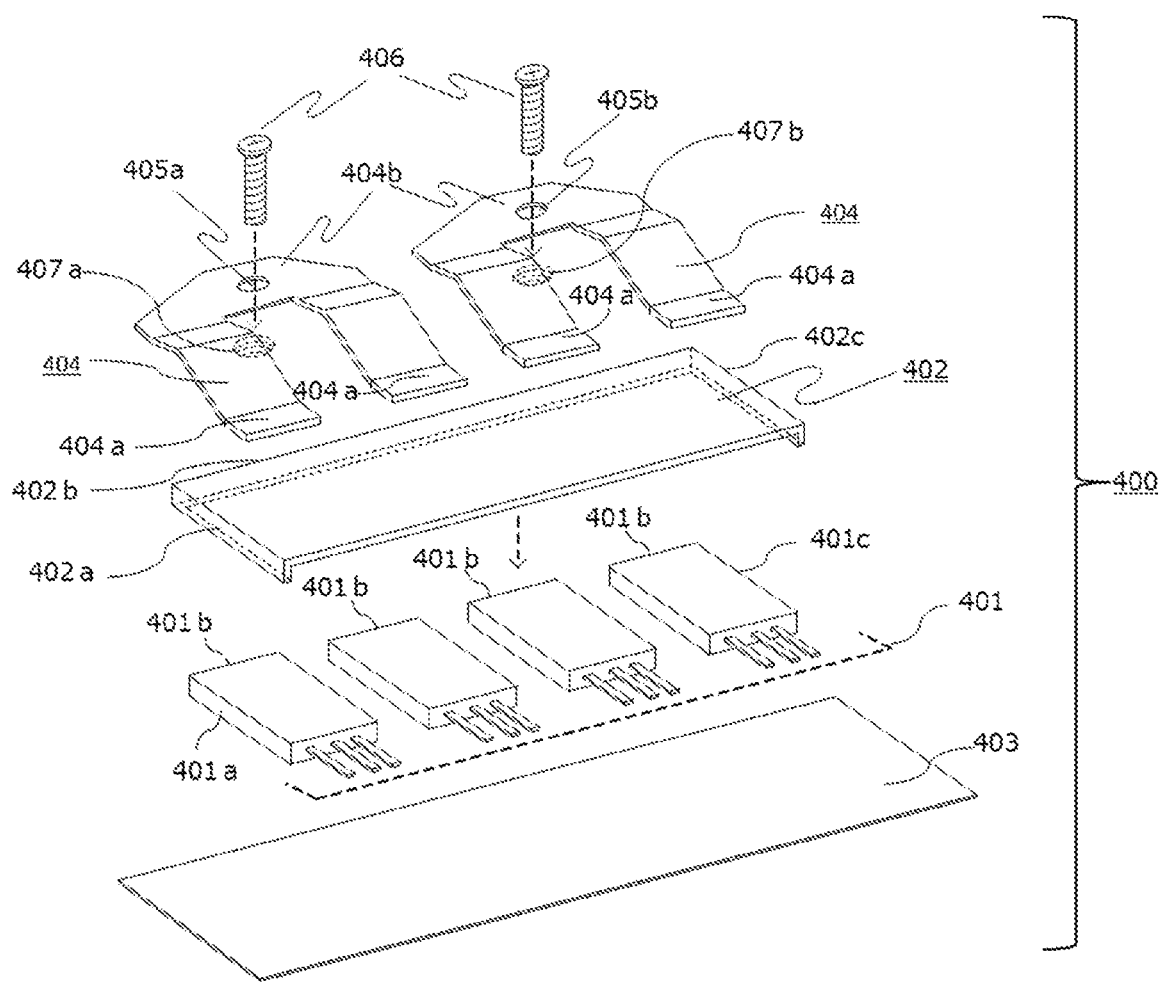
FIG. 4 is an assembly perspective view showing a semiconductor element holding structure according to Embodiment 3 of the present invention.

FIG. 4 is an assembly perspective view showing a holding structure 400 for a plurality of rectification element packages 401 each housing therein the rectification element 107a or 107b shown in FIG. 1.

A single plate 402 capable of covering the plurality of rectification element packages 401 is disposed in contact with upper surfaces of the plurality of (in this drawing, four) rectification element packages 401. The plate 402 is made of a material such as metal or resin, and outer peripheral surfaces 402a, 402b, and 402c that are bent perpendicularly from the upper surface of the plate toward the rectification element packages 401 are formed on the outer peripheral portion of the plate 402. The outer peripheral surface 402b is engaged with a side portion 401b of each of the plurality of rectification element packages 401, and the outer peripheral surfaces 402a and 402c are respectively engaged with side portions 401a and 401c located at end portions of the plurality of rectification element packages 401. A heat dissipation sheet 403 is disposed in contact with lower surfaces of the rectification element packages 401. One end portion 404a of each of a plurality of (in this drawing, two) spring members 404 is in contact with the upper surface of the plate 402, fixing screws 406 pass through spring member hole portions 405a and 405b which are formed in the other end portions 404b and through which the fixing screws pass, and thus the fixing screws 406 are screwed with screw grooves of cooler hole portions 407a and 407b provided in the cooler. Consequently, the spring members 404 are mechanically fixed to the cooler, and also press the plate 402, the rectification element package 401, and the heat dissipation sheet 403 against the cooler.

Since the plate 402 is pressed against the upper surfaces of the plurality of rectification element packages 401 by such a holding structure 400, it is possible to block any oxygen from flowing due to occurrence of cracks in each of the rectification element packages 401 when the rectification element undergoes a short circuit failure. Since the area of the plate 402 is configured to be larger than the total area of the plurality of rectification element packages 401, the upper surfaces of the plurality of rectification element packages 401 can be reliably covered by the plate 402. In addition, the plate 402 has the perpendicular outer peripheral surfaces 402a, 402b, and 402c along the outer peripheral portion of the plate, and the single plate 402 is mounted so as to hold the plurality of rectification element packages 401 therein during assembly. Accordingly, it is possible to prevent positional displacement of the plate during assembly, and also to decrease the number of components, thus reducing the number of man-hours for assembly. As in Embodiments 1 and 2, a heat spreader (not shown) is disposed on the lower surfaces of the rectification element packages 401, providing a structure into which oxygen is difficult to flow. Furthermore, pressing against the cooler is performed by the spring members 404. Accordingly, the cooler serves the same function as that of the plate 402 and prevents entry of oxygen.

Recently, rectification elements, switching elements, and the like that use a wide bandgap semiconductor such as a SiC or GaN semiconductor as a semiconductor element, other than a Si semiconductor, have been increasingly used for an inverter circuit or the like. Such wide bandgap semiconductors are operated at a higher frequency than the Si semiconductor, and therefore, are generally considered to have higher failure probability, and thus are more likely to cause smoke emission and ignition. However, application of the present invention makes it possible to prevent smoke emission and ignition, and is suitable for a power semiconductor element using a wide bandgap semiconductor.

It is noted that, within the scope of the present invention, the above embodiments may be freely combined with each other, or each of the above embodiments may be modified or simplified as appropriate.

DESCRIPTION OF THE REFERENCE CHARACTERS 201, 301, 401 rectification element package
204, 302, 402 plate
209, 306, 406 fixing screw
304, 404 spring member
207, 303, 403 heat dissipation sheet

The invention claimed is:
1. A semiconductor element holding and ignition prevention device comprising:
a package that houses a power semiconductor element therein and that dissipates heat to a cooler from a first surface of the package;
a plate covering a second surface of the package that opposes a first surface of the package, the plate includ- ing outer peripheral surfaces that border an outer peripheral portion of the plate and that are perpendicular to the plate; and a fastener that passes through a main housing portion of the package and that presses together the plate, the main housing portion of the package and the cooler so that the plate, the main housing portion of the package and the cooler are fixed together so as to prevent oxygen inflow into the package via cracks in the package, thereby making it possible to prevent smoke emission by and ignition of the power semiconductor element, wherein one end of the fastener is engaged with the plate, and the other end of the fastener passes through the plate and the main housing portion of the package so as to be fastened to the cooler.

2. The semiconductor element holding and ignition prevention device according to claim 1, wherein a first surface the plate has an area larger than a second surface of the plate, and the first surface of the plate is located in the outer peripheral portion of the plate.

3. The semiconductor element holding and ignition prevention device according to claim 2, wherein inner peripheral surfaces standing perpendicularly from the plate along the outer peripheral portion of the plate are engaged with side surfaces of the main housing portion of the package.

4. The semiconductor element holding and ignition prevention device according to claim 3, wherein a plurality of packages are covered by the plate.

5. The semiconductor element holding and ignition prevention device according to claim 2, wherein a plurality of packages are covered by the plate.

6. The semiconductor element holding and ignition prevention device according to claim 1, wherein a first surface the plate has an area larger than a second surface of the plate, and the first surface of the plate is located in the outer peripheral portion of the plate.

7. The semiconductor element holding and ignition prevention device according to claim 6, wherein inner peripheral surfaces standing perpendicularly from the plate along the outer peripheral portion of the plate are engaged with side surfaces of the main housing portion of the package.

8. The semiconductor element holding and ignition prevention device according to claim 7, wherein a plurality of packages are covered by the plate.

9. The semiconductor element holding and ignition prevention device according to claim 6, wherein a plurality of packages are covered by the plate.

10. The semiconductor element holding and ignition prevention device according to claim 1, wherein a protrusion formed at the outer peripheral portion of the plate toward the second surface of the package is engaged with a recess formed on the second surface of the main housing portion of the package.

11. The semiconductor element holding and ignition prevention device according to claim 1, wherein, a protrusion formed at the outer peripheral portion of the plate toward the second surface of the package is engaged with a recess formed on the second surface of the main housing portion of the package.

12. The semiconductor element holding and ignition prevention device according to claim 1, further comprising a spring member, wherein one end of the spring member is fixed to the cooler and another end of the spring member presses the plate.

13. The semiconductor element holding and ignition prevention device according to claim 1, wherein the fastener is a screw, one end of the screw is engaged with the plate, and the other end of the screw passes through the plate and the package so as to be screwed to the cooler.

14. The semiconductor element holding and ignition prevention device according to claim 1, wherein the power semiconductor element is a wide bandgap semiconductor.

15. A power conversion device using the semiconductor element holding and ignition prevention device according to claim 1.

* * * * *